United States Patent [19]

Yamano et al.

[11] Patent Number: 5,108,871
[45] Date of Patent: Apr. 28, 1992

[54] LITHOGRAPHIC PRINTING PLATE MATERIAL IMPROVED IN WATER RETENTION CHARACTERISTICS

[75] Inventors: Motozo Yamano; Hiroshi Nishinoiri; Shigeru Iguchi, all of Nagaokakyo, Japan

[73] Assignee: Mitsubishi Paper Mills Limited, Tokyo, Japan

[21] Appl. No.: 511,743

[22] Filed: Apr. 20, 1990

[30] Foreign Application Priority Data

Apr. 24, 1989 [JP] Japan .................................. 1-105434

[51] Int. Cl.$^5$ .............................................. G03C 5/54
[52] U.S. Cl. ..................... 430/204; 430/206; 430/216; 430/227; 430/232
[58] Field of Search ............... 430/204, 206, 232, 227, 430/404, 230, 216

[56] References Cited

U.S. PATENT DOCUMENTS 4,160,670  7/1979  Tsubai et al. ...................... 430/204
4,361,639  11/1982  Kunadu et al. ..................... 430/204

Primary Examiner—Richard L. Schilling
Attorney, Agent, or Firm—Cushman, Darby & Cushman

[57] ABSTRACT

Printing endurance of a lithographic printing plate made by using silver complex diffusion transfer process is markedly improved and besides staining which occurs during printing can be effectively inhibited by containing in at least one of a layer which contains nuclei for physical development comprising a heavy metal of a sulfide thereof and a layer contiguous to said layer at least one water-soluble synthetic polymer having the following structural units:

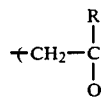

A:

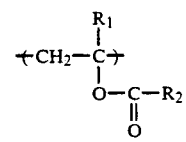

B:

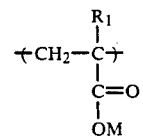

C:

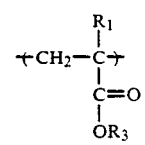

D:

wherein
A:B = 100:0–50:50 (molar ratio)
C:D = 100:0–50:50 (molar ratio)
(A+B):(C+D) = 95:5–5:95 (molar ratio) and $R_1$ represents a hydrogen atom or an alkyl group of 1–6 carbon atoms, $R_2$ represents a hydrogen atom or an alkyl group of 1–20 carbon atoms, $R_3$ represents an alkyl group of 1–20 carbon atoms and M represents a hydrogen atom or a cation.

9 Claims, No Drawings

LITHOGRAPHIC PRINTING PLATE MATERIAL IMPROVED IN WATER RETENTION CHARACTERISTICS

BACKGROUND OF THE INVENTION

The present invention relates to a method for improving printing characteristics especially printing endurance of images of fine dots and fine lines formed on offset printing plate made using silver complex diffusion transfer process and furthermore inhibiting of occurrence of printing stain.

Lithographic printing plate consists of greasy ink receptive oleophilic image portion and ink repellent oleophobic non-image portions, the latter being generally water receptive hydrophilic areas.

Therefore, the customary lithographic printing is carried out by feeding both water and ink to the printing plate surface to allow the image portion to receive preferentially the colored ink and the non-image portion to receive preferentially water and then transferring the ink deposited on the image portion onto a substrate such as paper. In order to obtain a print of good quality, therefore, it is necessary that oleophilicity of the image portion and hydrophilicity of the non-image background portion are both strong enough so that when water and ink are applied the image portion may receive sufficient amount of ink while the non-image portion may completely repel the ink.

Generally, printing stain in lithographic printing does not occur due to simple causes, but occurs due to various causes. For example, the printing stain may be caused by properties inherent to printing plate materials, printing ink, dampening solution, printing paper, condition of printing machine, temperature and humidity at printing and others. Thus, it is important to properly arrange these printing conditions and environment. However, from practical viewpoint, there have been demanded materials which can be used for printing under conditions of as wide as possible.

This is the same for the materials fundamentally stated in Japanese Patent Kokoku (Post Exam. Publn.) Nos. 48-16725 and 48-30562, namely, these materials are narrow in latitude for commercial various inks, are apt to change in printing characteristics with time before and after making into printing plates, and are apt to show stain in long running of printing. Improvements of these defects have been desired.

Printing materials which suffer from less staining in printing were proposed in Japanese Patent Kokoku (Post Exam. Publn.) Nos. 56-24262 and 57-22376, but these materials still have the defects that receptivity of ink, printing endurance and image reproducibility are deteriorated during long use of them.

SUMMARY OF THE INVENTION

The object of the present invention is to provide a lithographic printing plate material which is wide in scope of the number of times of use, excellent in various properties required for printing plate such as ink receptivity, printing endurance and image reproducibility and especially excellent in inhibition of staining in printing and besides excellent in stability with time.

DESCRIPTION OF THE INVENTION

The above object has been attained by a material from which a lithographic printing plate is made utilizing silver complex diffusion transfer process, wherein a layer containing physical development nuclei comprising a heavy metal or a sulfide thereof and/or a layer contiguous thereto contain at least one water-soluble synthetic polymer having the following structural units.

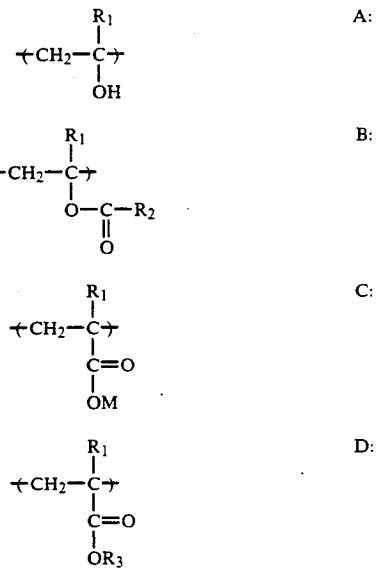

wherein:
A:B = 100:0 – 50:50 (molar ratio)
C:D = 100:0 – 50:50 (molar ratio)
(A+B):(C+D) = 95:5 – 5:95 (molar ratio)
$R_1$ = H or an alkyl group of $C_1$–$C_6$
$R_2$ = H or an alkyl group of $C_1$–$C_{20}$
$R_3$ = an alkyl group of $C_1$–$C_{20}$
M = H or a cation such as an alkali metal Molar ratio (A+B):(C+D) is preferably 90:10–10:90, more preferably 50:50–10:90. The above copolymers include those which are obtained by saponification of a copolymer of a vinyl ester and an ethylenically unsaturated carboxylic acid or a derivative thereof in a suitable solvent, preferably alcohol, water or alcohol-water mixed solution using an alkali catalyst as disclosed in Japanese Patent Kokoku (Post Exam. Publn.) No. 57-41298 and acrylic acid block copolymers containing a PVA polymer as one component which are prepared by radical polymerization of a radical polymerizable acrylic acid in the presence of a PVA polymer having a terminal mercapto group as disclosed in Japanese Patent Kokai (Laid-Open) No. 59-189113. Furthermore, copolymers of these vinyl esters with monomers copolymerizable with these vinyl esters are also included.

A highly water absorbing gel layer can be formed by adjusting an aqueous solution containing the copolymer of the present invention to a pH of about 1–6, preferably about 2–4 and drying it until water content reaches less than 100% by weight, preferably 50% by weight or less or impregnating or coating the aqueous solution in or on a substrate and then post-curing to perform crosslinking. ("highly water absorbing gel layer" used here means a layer which has a water absorption of several ten times—several hundred times the weight of the layer per se and which is less in reduction of water retention due to application of pressure or contact with other water absorbing materials.). Another method is to subject an aqueous solution containing the copolymer of the present invention to crosslinking with a polyfunctional compound reactable with hydroxyl group or carboxyl group such as dialdehyde compound, epihalohydrin compound, di(tri)epoxy compound, diisocyanate compound, or the like.

Polymerization degree of the copolymers of the present invention is not critical, but if it is too low, strength of the resulting highly water absorbing gel layer is low and if it is too high, coatability is deteriorated. The polymerization degree is preferably 700–3500.

In application of the copolymer of the present invention to lithographic printing plate materials, it is contained in a physical development nuclei layer and/or a layer contiguous thereto. The copolymer can be contained therein before or after coating of physical development nuclei layer, but considering stability of quality and easiness of production, it is most advantageous to add the copolymer together with physical development nuclei.

General amount of the copolymer used depends somewhat on kind, amount and properties of colloid material as physical development nuclei, but printing characteristics are influenced by the application amount per 1 square meter and the copolymer is applied in an amount of preferably 0.2 g/m$^2$ or less, more preferably 0.02–0.1 g/m$^2$. The copolymer of the present invention can be used in combination with water-soluble polymers as proposed in Japanese Patent Kokoku (Post Exam. Publn.) Nos. 56-24262 and 56-22376.

The thus obtained printing plate material can afford printing plate which is prevented from staining even when amount of water fed by printing machine is small and can keep the effect for longer running period of printing.

The present invention has no limitation in image receiving layer, support, and silver halide emulsion layer of lithographic printing plate material from which printing plate is made using silver complex diffusion transfer process and in the silver complex diffusion transfer processing conditions.

For example, there may be used supports for ordinary photographic photosensitive materials, e.g., synthetic resin films such as polyester film, polycarbonate film, polypropylene film and polystyrene film, water resistant coated papers such as polyethylene-coated paper and composite supports reinforced with aluminum.

As photosensitive silver halide emulsions, there may be used any photographic emulsions such as silver chloride, silver chlorobromide and silver bromide, which may contain an iodide. These photographic emulsions can be subjected to usual sulfur sensitization and noble metal sensitization, e.g., with gold and furthermore, to spectral sensitization to blue, green and red. The photographic emulsion may contain antifoggant, stabilizer and other additives such as developing agent, hardener, matting agent and inhibitor of unsharpness.

As the physical development nuclei which are one element constituting image receiving layer, there may be used known substances used in general silver complex diffusion transfer process. Examples are heavy metals such as gold, silver, copper, platinum, palladium and zinc and sulfide colloids thereof.

The resulting material is subjected to silver complex diffusion transfer processing and then, can be used for printing, as it is or after enhanced in ink receptivity by treating with compositions such as solutions containing organic compounds having —SH group or >C=S group as a skeleton as disclosed in Japanese Patent Kokoku (Post Exam. Publn.) No. 48-29723.

The present invention is explained by the following nonlimiting example.

EXAMPLE (I) Production of lithographic printing plate material:

A polyethylene-coated paper of 135 g/m$^2$ was subjected to corona discharge treatment and then a gelatin solution containing carbon black was coated on the corona discharge treated surface and thereafter thereon was coated an orthochromatically sensitized high contrast silver halide emulsion. This emulsion layer basically comprised 1.5 g/m$^2$ of silver chloride in terms of silver nitrate and 1.5 g/m$^2$ of gelatin based on the weight of silver halide in terms of silver nitrate and contained formalin and dimethylolurea as hardener.

This photographic material containing photosensitive silver halide emulsion was kept at 40° C. for 3 days and then was coated with palladium sulfide sol prepared in the following manner to make a lithographic printing plate material.

| Solution A | |
|---|---|
| Palladium chloride | 5 g |
| Hydrochloric acid | 40 ml |
| Water | 1,000 ml |
| Solution B | |
| Sodium sulfide | 86 g |
| Water | 1,000 ml |

The above solutions A and B were mixed with stirring and after 30 minutes, the mixture was passed through a column packed with an ion exchange resin (IR-120B, IRA-400) made for preparation of pure water and thereto was added the following mixture containing polymer and surfactant to obtain a coating solution

| Water-soluble polymer | 10 g, 20 g, 50 g or 100 g |
|---|---|
| Water | 18,000 ml |
| 10% Saponin | 20 ml |
| Total | 21,000 ml |

As the water-soluble polymer, water-soluble synthetic polymers as shown in Table 1 which were changed in polymerization ratio in accordance with the present invention and water-soluble synthetic polymers as shown in Table 2 were used in an amount of 10 g, 20 g, 50 g or 100 g. As blank sample, a coating solution containing no polymer was also prepared.

The resulting coating solution containing the physical development nuclei and the water-soluble polymer was coated at a coverage of 21 ml/m$^2$ and dried by heating. Each sample of lithographic printing plate material was subjected to forced heating at 50° C. 80%RH for 3 days and 9 days in order to examine change of printing characteristics with spontaneous lapse of time, especially deterioration on printing stain.

TABLE 1

| Sample No. | Structural unit | |
|---|---|---|
| | (A + B) (mol %) | (C + D) (mol %) |
| (1) | 10 | 90 |
| (2) | 50 | 50 |
| (3) | 90 | 10 |

The components B and D were contained in an amount of 5 mol%, respectively and $R_1$ represents H, $R_2$ and $R_3$ represent $CH_3$ and M represents Na.

(II) Processing:

Each of the photosensitive materials was exposed imagewise and then was dipped in transfer developer (C) having the following formulation at 30° C. for 30 minutes to carry out transfer development and subsequently was dipped in fixing solution (D) having the following formulation for 30 seconds (25° C.), squeezed to remove excess solution and dried under

| Transfer developer (C): | |
|---|---|
| Water | 1,500 ml |
| Sodium hydroxide | 20 g |
| Sodium sulfite | 100 g |
| Hydroquinone | 12 g |
| 1-Phenyl-3-pyrazolidone | 1 g |
| Sodium thiosulfate | 15 g |
| Potassium bromide | 3 g |
| Water to make up 2 liters. | |
| Fixing solution (D): | |
| Water | 1 liter |
| Colloidal silica (20% solution) | 1 liter |
| Citric acid | 10 g |
| Sodium citrate | 35 g |

(III) Printing:

The resulting printing plate was mounted on an offset printing machine A.B. Dick 350CD (trademark). The plate surface was wiped with a solution (E) having the following formulation and then printing was carried out. Printing room was at a temperature of 22° C. and a relative humidity of 60%.

| Solution (E): | |
|---|---|
| Water | 400 ml |
| Citric acid | 1 g |
| Sodium citrate | 3.5 g |
| 2-Mercapto-5-heptyl-1,3,5-oxadiazole | 0.5 g |
| Ethylene glycol | 50 ml |

Tap water was used as a dampening solution. Printing inks used were "F Gloss Sumi B" and "F Gloss Konai" supplied by Dainippon Ink & Chemicals Co. The ink "F Gloss Konai" was one of those which were liable to cause staining when used with conventional offset printing plates. The ink receptivity and the tendency to cause staining were evaluated in the following way:

(1) Evaluation of Ink receptivity: Sheets of printing paper were fed as soon as the inking roller comes into contact with the printing plate surface, using the ink "F Gloss Sumi B". Ink receptivity was evaluated by counting the number of sheet before a good print has been obtained.

(2) Evaluation of staining: This was evaluated by carrying out printing of 1,000 sheets with the ink "F Gloss Konai" and inspecting the 1,000th printed sheet. The rating was as follows:

○: No stain occurred.
Δ: Partial or slight stain occurred.
×: Heavy stain occurred all over the printed sheet.

(3) Evaluation of printing endurance: Printing of more than 1,000 prints was carried out and the number of printed sheets before omission of ink in the image portion began to occur was counted and printing endurance was evaluated by the following rating.

○: More than 3,000 printed sheets
Δ: 1,000–3,000 printed sheets
×: Less than 1,000 printed sheets

TABLE 2

| | Water-soluble polymers | |
|---|---|---|
| Plate No. | Kind | Amount g/m² |
| 1 | Polyvinyl alcohol | 0.01 |
| 2 | " | 0.02 |
| 3 | " | 0.05 |
| 4 | " | 0.10 |
| 5 | Carboxymethylcellulose | 0.01 |
| 6 | " | 0.02 |
| 7 | " | 0.05 |
| 8 | " | 0.1 |
| 9 | Polyacrylamide | 0.01 |
| 10 | " | 0.02 |
| 11 | " | 0.05 |
| 12 | " | 0.1 |
| 13 | Methylvinyl ether-maleic anhydride copolymer | 0.01 |
| 14 | Methylvinyl ether-maleic anhydride copolymer | 0.02 |
| 15 | Methylvinyl ether-maleic anhydride copolymer | 0.05 |
| 16 | Methylvinyl ether-maleic anhydride copolymer | 0.1 |
| 17 | Hydroxyethylcellulose | 0.01 |
| 18 | " | 0.02 |
| 19 | " | 0.05 |
| 20 | " | 0.1 |
| 21 | Gum arabic | 0.01 |
| 22 | " | 0.02 |
| 23 | " | 0.05 |
| 24 | " | 0.1 |
| 25 | Sodium polyacrylate | 0.01 |
| 26 | " | 0.02 |
| 27 | " | 0.05 |
| 28 | " | 0.1 |
| 29 | Pyridine-acrylamide copolymer | 0.01 |
| 30 | " | 0.02 |
| 31 | " | 0.05 |
| 32 | " | 0.1 |
| 33 | Sample No. (1) | 0.01 |
| 34 | " | 0.02 |
| 35 | " | 0.05 |
| 36 | " | 0.1 |
| 37 | Sample No. (2) | 0.01 |
| 38 | " | 0.02 |
| 39 | " | 0.05 |
| 40 | " | 0.1 |
| 41 | Sample No. (3) | 0.01 |
| 42 | " | 0.02 |
| 43 | " | 0.05 |
| 44 | " | 0.1 |
| 45 | — (none) | — |

TABLE 3

| Plate No. | 1) Ink receptivity | 2) Stain Fresh plate | Heated for 3 days | Heated for 9 days | 3) Printing endurance |
|---|---|---|---|---|---|
| 1 | 20 | × | × | × | ○ |
| 2 | 30 | × | × | × | ○ |
| 3 | 50 | Δ | × | × | Δ |
| 4 | 100 | Δ | Δ | × | × |
| 5 | 20 | × | × | × | ○ |
| 6 | 30 | Δ | × | × | Δ |
| 7 | 40 | Δ | Δ | × | × |
| 8 | 80 | Δ | Δ | × | × |
| 9 | 20 | × | × | × | ○ |
| 10 | 30 | Δ | × | × | Δ |
| 11 | 40 | Δ | Δ | × | × |
| 12 | 80 | Δ | Δ | × | × |
| 13 | 20 | × | × | × | ○ |
| 14 | 30 | Δ | × | × | ○ |
| 15 | 60 | Δ | Δ | × | Δ |
| 16 | 90 | Δ | Δ | × | × |
| 17 | 20 | Δ | × | × | ○ |

TABLE 3-continued

| Plate No. | Ink receptivity | Fresh plate | Heated for 3 days | Heated for 9 days | Printing endurance |
|---|---|---|---|---|---|
| 18 | 30 | Δ | X | X | ○ |
| 19 | 40 | Δ | X | X | Δ |
| 20 | 70 | Δ | X | X | X |
| 21 | 20 | Δ | X | X | ○ |
| 22 | 40 | Δ | Δ | X | ○ |
| 23 | 70 | Δ | Δ | X | Δ |
| 24 | 100 | Δ | Δ | Δ | X |
| 25 | 20 | X | X | X | ○ |
| 26 | 30 | Δ | X | X | ○ |
| 27 | 40 | Δ | Δ | Δ | Δ |
| 28 | 50 | ○ | Δ | X | X |
| 29 | 20 | Δ | X | X | ○ |
| 30 | 30 | ○ | Δ | X | ○ |
| 31 | 40 | ○ | Δ | Δ | Δ |
| 32 | 50 | ○ | ○ | Δ | X |
| 33 | 20 | Δ | Δ | Δ | ○ |
| 34 | 30 | ○ | ○ | ○ | ○ |
| 35 | 40 | ○ | ○ | ○ | ○ |
| 36 | 50 | ○ | ○ | ○ | ○ |
| 37 | 20 | Δ | Δ | Δ | ○ |
| 38 | 30 | ○ | ○ | ○ | ○ |
| 39 | 40 | ○ | ○ | ○ | ○ |
| 40 | 60 | ○ | ○ | ○ | ○ |
| 41 | 20 | Δ | Δ | Δ | ○ |
| 42 | 40 | Δ | Δ | Δ | ○ |
| 43 | 60 | ○ | ○ | ○ | ○ |
| 44 | 80 | ○ | ○ | ○ | ○ |
| 45 | 20 | X | X | X | ○ |

From the above results, it was confirmed that by using the water-soluble synthetic polymers of the present invention, printing characteristics were improved, especially staining during printing was inhibited and besides stability with time was excellent.

The lithographic printing plate material of the present invention which contains at least one water-soluble synthetic polymer mentioned here which forms a highly water absorbing gel layer by drying with heat and curing to cause crosslinking in a physical development nuclei layer and/or a layer contiguous thereto provides the following advantageous effects.

That is, there is provided a lithographic printing plate material which is wide for allowance in amount of use, excellent in various characteristics as printing plate, namely, high ink receptivity, less stain during printing, high printing endurance and high image reproducibility, especially free from increase of staining with lapse of time and thus is stable.

Furthermore, after plate making, the resulting printing plate is stable with time and excellent in printing characteristics, especially there occurs no increase of staining during printing.

What is claimed is:

1. A lithographic printing plate material using silver complex diffusion transfer process wherein at least one of a layer which contains nuclei for physical development comprising a heavy metal or a sulfide thereof and a layer contiguous to said layer contain at least one water-soluble synthetic polymer having the following structural units:

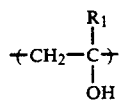 A:

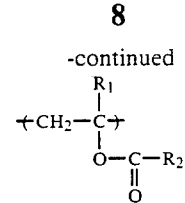 B:

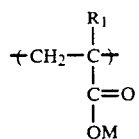 C:

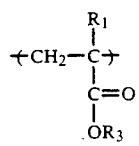 D:

wherein
A:B = 100:0 − 50:50 (molar ratio)
C:D = 100:0 − 50:50 (molar ratio)
(A+B):(C+D) = 95:5 − 5:95 (molar ratio)
and $R_1$ represents a hydrogen atom or an alkyl group of 1-6 carbon atoms, $R_2$ represents a hydrogen atom or an alkyl group of 1-20 carbon atoms. $R_3$ represents an alkyl group of 1-20 carbon atoms and M represents a hydrogen atom or a cation.

2. A lithographic printing plate material according to claim 1, wherein the molar ratio (A+B):(C+D) is 90:10−10:90.

3. A lithographic printing plate material according to claim 1, wherein the water-soluble polymer has a polymerization degree of 700-3500.

4. A lithographic printing plate material according to claim 1, wherein amount of the water-soluble polymer is 0.2 g/m² or less.

5. A lithographic printing plate material according to claim 5, wherein the amount of the water-soluble polymer is 0.02-0.1 g/m².

6. A lithographic printing plate material according to claim 1, wherein the heavy metal for the nuclei for physical development is selected from the group consisting of gold, silver, copper, platinum, palladium and zinc.

7. A method for making a lithographic printing plate which comprises the steps of:
subjecting a lithographic printing plate including a support, a silver halide emulsion layer provided on the support and the physical development nuclei layer provided on the emulsion layer, to exposure and then subjecting to diffusion transfer development in presence of a complexing agent wherein at least one of a layer which contains nuclei for physical development comprising a heavy metal or a sulfide thereof and a layer contiguous to said layer contain at least one water soluble synthetic polymer having the following structural units:

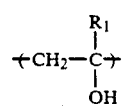 A:

-continued

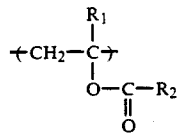

B:

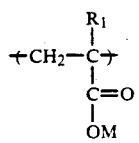

C:

-continued

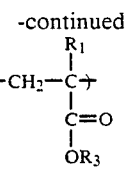

D:

wherein
A:B = 100:0 — 50:50 (molar ratio)
C:D = 100:0 — 50:50 (molar ratio)
(A:B):(C+D) = 95:5 — 5:95 (molar ratio)
and $R_1$ represents a hydrogen atom or an alkyl group of 1-6 carbon atoms, $R_2$ represents a hydrogen atom or an alkyl group of 1-20 carbon atoms, $R_3$ represents an alkyl group of 1-20 carbon atoms and M represents a hydrogen atom or a cation.

8. A method of printing comprising the steps of feeding water and ink to the lithographic printing plate made by the method of claim 7.

9. A method of printing employing a lithographic printing plate comprising the steps of:
treating the lithographic printing plate formed in claim 7 with water; and applying ink to the printing plate so that the ink is preferentially deposited on the silver image portions prior to printing.

* * * * *